United States Patent
Han et al.

(10) Patent No.: US 7,842,603 B2
(45) Date of Patent: Nov. 30, 2010

(54) METHOD FOR FABRICATING SEMICONDUCTOR MEMORY DEVICE

(75) Inventors: Kyoung-Sik Han, Kyoungki-do (KR); Young-Jun Kim, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 767 days.

(21) Appl. No.: 11/648,361

(22) Filed: Dec. 28, 2006

(65) Prior Publication Data

US 2008/0003809 A1    Jan. 3, 2008

(30) Foreign Application Priority Data

Jun. 29, 2006   (KR) ............... 10-2006-0059598
Oct. 31, 2006   (KR) ............... 10-2006-0106871

(51) Int. Cl.
     *H01L 21/4763*     (2006.01)
(52) U.S. Cl. ............... 438/627; 438/635; 257/E21.495; 257/E21.582
(58) Field of Classification Search .......... 438/627, 438/635
     See application file for complete search history.

(56) References Cited

U.S. PATENT DOCUMENTS

| | | | |
|---|---|---|---|
| 5,043,299 A * | 8/1991 | Chang et al. ............ | 438/674 |
| 5,930,639 A | 7/1999 | Schuele et al. | |
| 6,630,074 B1 * | 10/2003 | Rath et al. .............. | 252/79.3 |
| 6,693,036 B1 * | 2/2004 | Nogami et al. .......... | 438/692 |
| 2004/0219729 A1 | 11/2004 | Kang | |

FOREIGN PATENT DOCUMENTS

| | | |
|---|---|---|
| CN | 1229272 | 9/1999 |
| JP | 2002-305288 | 10/2002 |
| KR | 10-0430579 | 4/2004 |
| KR | 10-2005-0032305 | 4/2005 |
| KR | 10-2006-0072217 | 6/2006 |
| KR | 10-0613383 | 8/2006 |

* cited by examiner

*Primary Examiner*—Alexander G Ghyka
(74) *Attorney, Agent, or Firm*—Blakely, Sokoloff, Taylor & Zafman

(57) ABSTRACT

A method for fabricating a semiconductor memory device includes forming an insulation layer including a contact plug over a substrate structure, forming a metal line structure over the insulation layer, the metal line structure including a patterned diffusion barrier layer and a metal line and contacting the contact plug, and oxidizing a surface of the metal line to form a passivation layer over the metal line.

12 Claims, 4 Drawing Sheets

METHOD FOR FABRICATING SEMICONDUCTOR MEMORY DEVICE

CROSS-REFERENCES TO RELATED APPLICATIONS

The present invention claims priority of Korean patent application numbers 10-2006-0059598 and 10-2006-0106871, filed on Jun. 29, 2006 and Oct. 31, 2006, respectively, which are incorporated by reference in their entirety.

BACKGROUND OF THE INVENTION

The present invention relates to a method for fabricating a semiconductor memory device; and more particularly, to a method for fabricating a metal line of a semiconductor memory device.

As semiconductor memory devices have become highly integrated, semiconductor memory devices need to operate at higher speeds. Recently, a method for reducing resistance of a metal line has been developed to fabricate a flash memory device which can operate at high speed. As a part of the method, a metal having low surface resistance (Rs) such as tungsten, aluminum, or copper is used.

FIGS. 1A and 1B are cross-sectional views illustrating a typical method for fabricating a semiconductor memory device (e.g., NAND flash memory). As shown in FIG. 1A, a plurality of gate structures 17 functioning as gates of the memory device are formed over a substrate 10. Each of the gate structures 17 is formed by sequentially stacking a tunnel oxide layer 11, a floating gate 12, a dielectric layer 13, a control gate 14, and a hard mask 15.

Although FIG. 1A illustrates only the gates of the memory cell, the semiconductor memory device includes a plurality of memory cells formed with a string structure. A drain selection transistor (not shown) connected to a bit line and a source selection transistor (not shown) connected to a common source line are formed over sidewalls of the string structure.

An insulation layer 18 is formed over a height difference of an upper surface of the above resulting structure including the gate structures 17. The insulation layer 18 serves a role as an etch barrier layer during a subsequent etching process. A first insulation layer 19 is formed over the insulation layer 18 to cover the above resulting structure including the gate structures 17.

A portion of the first insulation layer 19 and the insulation layer 18 is etched to form a first contact hole (not shown) exposing an active region, i.e., a source region of the source selection transistor, of the substrate 10. A source contact plug 20 isolated in the first contact hole is formed.

A second insulation layer 21 is formed over the first insulation layer 19 that is already patterned. A portion of the first insulation layer 19, the second insulation layer 21, and the insulation layer 18 is etched to form a second contact hole (not shown) exposing the active region, i.e., a drain region of the drain selection transistor, of the substrate 10. A drain contact plug 22 isolated in the second contact hole is formed.

An etch stop layer 23 and a third insulation layer 24 are formed over the second insulation layer 21 that is already patterned. A dual damascene process is performed to etch the third insulation layer 24, the etch stop layer 23, and the second insulation layer 21 that is already patterned. As a result, trenches and via contact holes are formed. Hereinafter, the trenches and the via contact holes will be together referred to as openings 25.

As shown in FIG. 1B, a plurality of diffusion barrier layers 26 (see FIG. 2) are formed over inner surfaces of the openings 25. A metal interconnection material having low surface resistance such as tungsten is formed over an entire surface of the above resulting structure including the third insulation layer 24 that is already patterned to fill the openings 25.

The metal interconnection material is planarized to form a plurality of metal lines 27 respectively connected to the source contact plug 20 and the drain contact plug 22. A fourth insulation layer 28 is formed over the third insulation layer 24 that is already patterned including the metal lines 27. The fourth insulation layer 28 serves a role as a passivation layer protecting the metal lines 27.

Since a physical vapor deposition (PVD) process is performed to form the fourth insulation layer 28 using a high density plasma (HDP) layer after the metal lines 27 are formed, surfaces of the metal lines 27 may be damaged by a hydrogen ($H_2$) gas or plasma. Thus, resistance may be increased.

The typical method for fabricating the semiconductor memory device shown in FIGS. 1A and 1B have the following limitations. These limitations will be explained in relation to FIG. 2. FIG. 2 is a cross-sectional view enlarging a portion 'A' shown in FIG. 1B.

According to the typical method, a dual damascene process is performed to form the metal lines. The dual damascene process generates two elements which block a fast transmission of electric charges of the metal lines. One is high surface resistance of a titanium (Ti)/titanium nitride L (TiN) layer forming the diffusion barrier layers 26. The other one is an increase in capacitance by a nitride layer forming the etch stop layer 23. Accordingly, it is difficult to attain a high speed operation of the typical semiconductor memory device, which is required for large-scale integration.

SUMMARY OF THE INVENTION

One specific embodiment of the present invention is directed to provide a method for fabricating a semiconductor memory device, wherein the method removes elements which block a fast transmission of electric charges of a metal line and thus, the semiconductor memory device can operate at high speed.

Another specific embodiment of the present invention is directed to provide a method for fabricating a semiconductor memory device, wherein the method prevents damage to a surface of a metal line during formation of an insulation layer after the metal line is formed.

In accordance with one aspect of the present invention, there is provided a method for fabricating a semiconductor memory device, including: forming an insulation layer including a contact plug over a substrate structure; forming a metal line structure over the insulation layer, the metal line structure including a patterned diffusion barrier layer and a metal line and contacting the contact plug; and oxidizing a surface of the metal line to form a passivation layer over the metal line.

In accordance with another aspect of the present invention, there is provided a method for fabricating a semiconductor memory device, including: forming a first insulation layer over a substrate structure including a first source contact plug; forming a second insulation layer over the first insulation layer; etching the first and second insulation layers to form a first contact hole exposing the substrate; forming a drain contact plug filling the first contact hole; etching the second insulation layer to form a second contact hole exposing the first source contact plug; forming a second source contact plug filling the second contact hole; forming a diffusion barrier layer over the second source contact plug and the drain contact plug; forming a metal line layer over the diffusion barrier layer; etching the metal line layer and the diffusion barrier layer to form a metal line structure including a patterned diffusion layer and a metal line; and oxidizing a surface of the metal line to form a passivation layer over the surface of the metal line.

DESCRIPTION OF SPECIFIC EMBODIMENTS

Figure 1A:
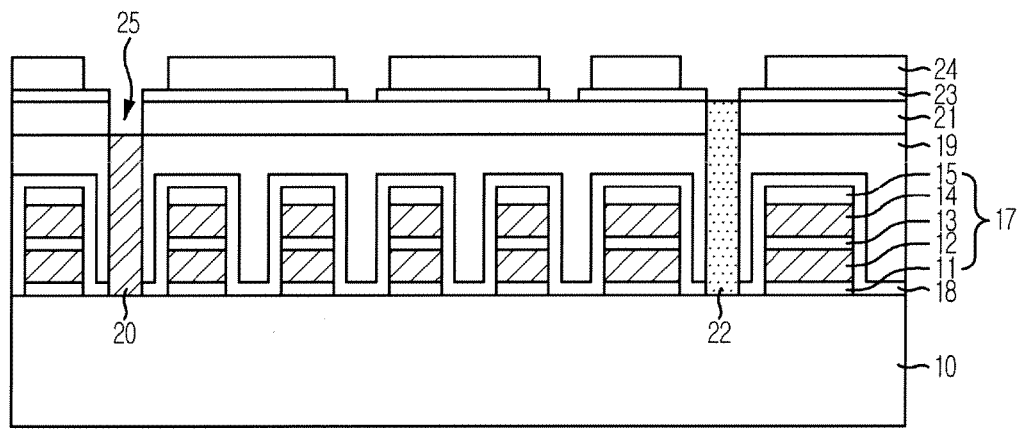
FIGS. 1A and 1B are cross-sectional views illustrating a typical method for fabricating a semiconductor memory device.
Figure 1B:
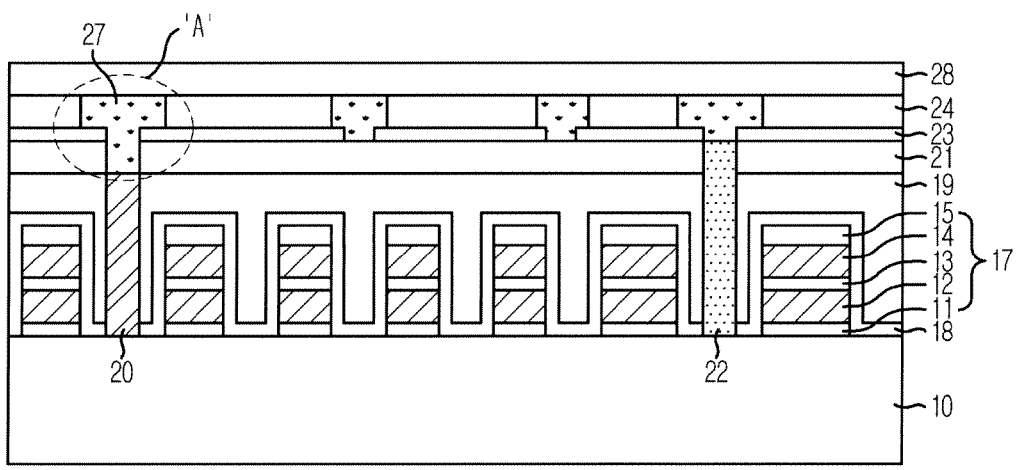
Figure 2:
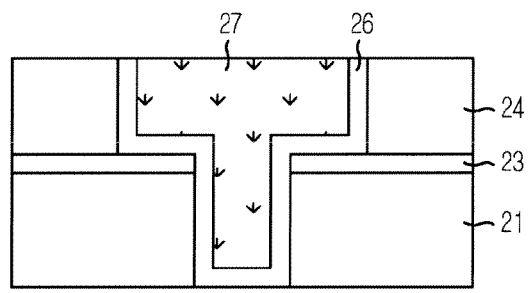
FIG. 2 is a cross-sectional view enlarging a portion 'A' shown in FIG. 1B.

Hereinafter, detailed descriptions on certain embodiments of the present invention will be provided with reference to the accompanying drawings. Herein, the thickness of layers and regions may be magnified in the accompanying drawings to clearly show the layers and the regions. Also, when a layer is described to be formed over a layer or a substrate, either the layer can be directly formed on the other layer or the substrate, or a third layer may be disposed therebetween. Furthermore, the same or like reference numerals denote the same or like elements even in different drawings.

Figure 3A:
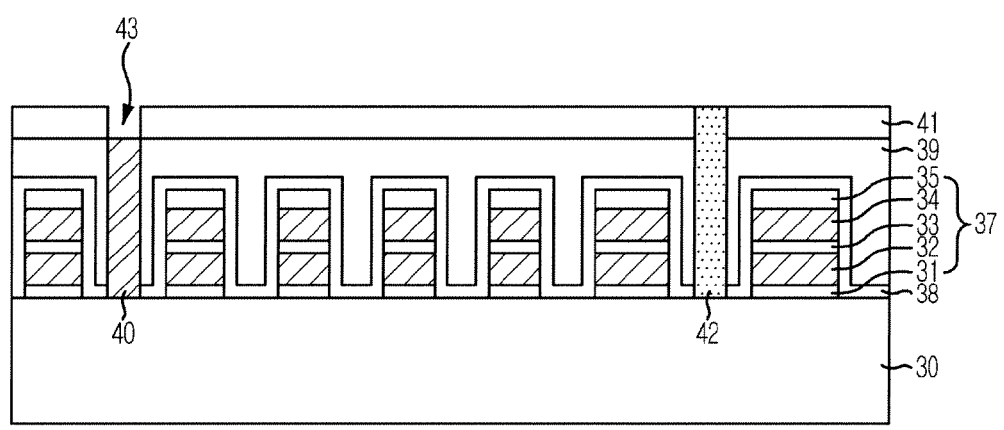
FIGS. 3A and 3B are cross-sectional views illustrating a method for fabricating a semiconductor memory device in accordance with an embodiment of the present invention.
Figure 3B:
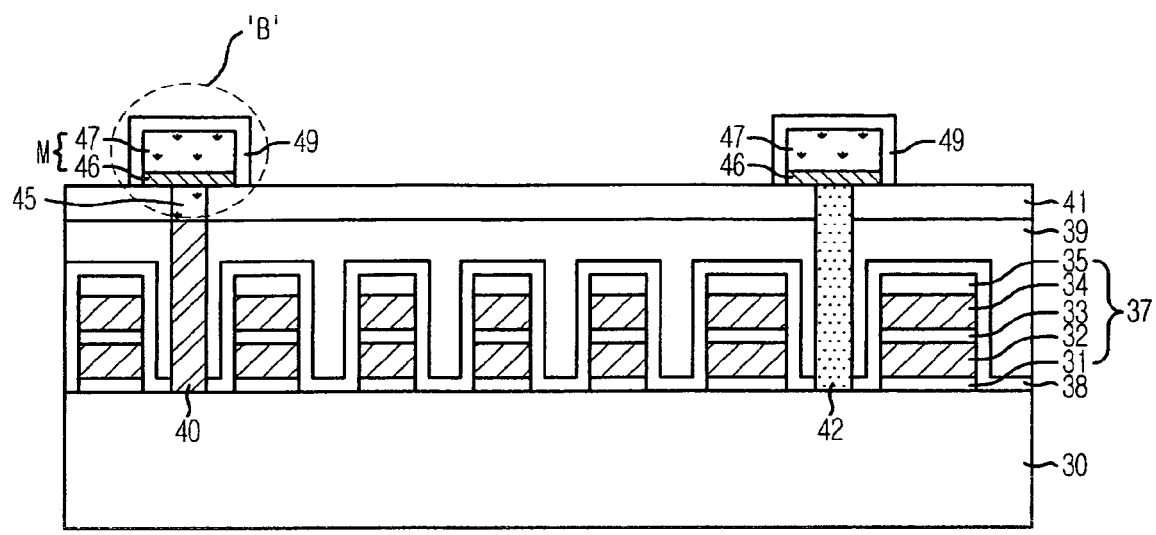

FIGS. 3A and 3B are cross-sectional views illustrating a method for fabricating a semiconductor memory device in accordance with an embodiment of the present invention. As shown in FIG. 3A, a plurality of gate structures 37 functioning as gates of a memory cell, are formed over a substrate 30. Each of the gate structures 37 is formed with a stack structure of a gate insulation layer 31, a floating gate 32, a dielectric layer 33, a control gate 34, and a hard mask 35. A tungsten layer, a tungsten silicide layer or a stack structure thereof can be interposed between the control gate 34 and the hard mask 35.

An ion-implantation process for forming a source/drain region is performed on the substrate 30 exposed between the gate structures 37. An insulation layer 38 is formed over a height difference of an upper surface of the above resulting structure including the gate structures 37. The insulation layer 38 includes a nitride-based material, and serves a role as an etch barrier layer during a subsequent etching process.

A first insulation layer 39 is formed over the insulation layer 38 to cover the gate structures 37. The first insulation layer 39 includes one selected from a group consisting of a high density plasma (HDP) layer, a borophosphosilicate glass (BPSG) layer, a phosphosilicate glass (PSG) layer, a plasma enhanced tetraethylortho silicate (TEOS) layer, a plasma enhanced chemical vapor deposition (PECVD) layer, an undoped silicate glass (USG) layer, a fluorinated silicate glass (FSG) layer, a carbon doped oxide (CDO) layer, an organic silicate glass (OSG) layer, and a combination thereof.

A portion of the first insulation layer 39 and the insulation layer 38 is etched to form a first contact hole (not shown) exposing an active region, i.e., a source region of a source selection transistor, of the substrate 30. A source contact plug 40 isolated in the first contact hole is formed. The source contact plug 40 is connected to a ground through a common source line. Accordingly, the source contact plug 40 will be referred to as a common source line hereinafter.

A second insulation layer 41 is formed over the first insulation layer 39 that is already patterned. A portion of the first insulation layer 39, the second insulation layer 41, and the insulation layer 38 is etched to form a second contact hole (not shown) exposing the active region, i.e., a drain region of a drain selection transistor, of the substrate 30.

A drain contact plug 42 isolated in the second contact hole is formed. A portion of the second insulation layer 41 that is already patterned is etched to expose the common source line 40. As a result, a third contact hole 43 is formed.

As shown in FIG. 3B, a plug material (e.g. tungsten) is formed to fill the third contact hole 43 (see FIG. 3A) and then, a chemical mechanical polishing (CMP) process is performed to planarize the plug material. A contact plug 45 isolated in the third contact hole 43 is formed. The contact plug 45 serves a role as a carrier transferring a signal to the common source line 40.

The following conditions are required to perform the CMP process. A rotating speed of a turn table (TT) on which the substrate 30 is positioned ranges from approximately 50 rpm to approximately 1,000 revolutions per minute (rpm). A rotating speed of a top ring (TR) head pressing the substrate 30 from the upside to fix the substrate 30 at the turn table (TT) ranges from approximately 3 rpm to approximately 60 rpm. A pressure of a main air bag exerted to the whole of the substrate 30, and a pressure of a center air bag exerted to the center of the substrate 30 are individually in a range of approximately 100 hectorpascal (hpa) to approximately 200 hpa. A pressure of a retainer air bag making the substrate 30 stay positioned on the turn table (TT) rages from approximately 200 hpa to approximately 300 hpa. A flow rate of slurry ranges from approximately 50 sccm/min to approximately 200 sccm/min. A level of pH ranges from approximately 2 to approximately 7, and a concentration of oxidizer ($H_2O_2$) contained in the slurry ranges from approximately 2% to approximately 4%.

A Ti/TiN layer and a tungsten layer are sequentially formed over the above resulting structure including the contact plug 45 to form metal line structures M. The tungsten layer is formed using silane ($SiH_4$), tungsten hexafluoride ($WF_6$), and argon (Ar) at a pressure ranging from approximately 30 Torr to approximately 50 Torr, and a temperature ranging from approximately 300° C. to approximately 400° C.

A photoresist layer is formed and then, a photo-exposure process and a developing process using a photomask are sequentially performed to form a photoresist pattern (not shown). An etching process is performed using the photoresist pattern as an etch mask to etch the tungsten layer and the Ti/TiN layer. The etching process proceeds in the condition of using $SF_6$ and $N_2$ gases, a power ranging from approximately 300 W to approximately 500 W, a pressure ranging from approximately 5 mTorr to approximately 10 mTorr, and a temperature ranging from approximately 5° C. to approximately 10° C. As a result, the metal line structures M each includes a patterned diffusion barrier layer 46 (i.e., the Ti/TiN layer) and a metal line 47 (i.e., the tungsten layer), which are stacked over each other.

The metal lines 47 can include other metal-based materials having low specific resistance in addition to the tungsten layer. After the formation of the metal line structures M, the photoresist pattern is removed. A cleaning process is performed to remove impurities generated during the etching process. The cleaning process uses a cleaning chemical capable of oxidizing surfaces of the metal lines 47. The cleaning chemical serving as an oxidation chemical includes one obtained by mixing sulfuric acid ($H_2SO_4$), $H_2O_2$, deionized water, and hydrogen fluoride (HF). $H_2SO_4$, $H_2O_2$, and deionized water are mixed in a ratio of approximately 2 parts of $H_2SO_4$ to approximately 5 parts of $H_2O_2$ to approximately 33 parts of deionized water. HF having a flow rate ranging from approximately 100 ppm to approximately 300 ppm is added to the above mixture of $H_2SO_4$, $H_2O_2$, and deionized water.

More specifically, an oxidation is automatically generated by $H_2O_2$ included in the cleaning chemical during the cleaning process and as a result, a plurality of oxide layers 49 are formed as passivation layers over the surfaces of the metal lines 47. The oxide layers 49 do not include metal materials but insulation layers. Accordingly, the oxide layers 49 do not effect the surface resistance of the metal lines 47. The oxide layers 49 protect the metal line structures M, more specifically, the metal lines 47 from a hydrogen ($H_2$) gas and plasma generated during a subsequent process of forming an insulation layer.

The formation of the oxide layers 49 by the cleaning chemical is expressed as the following chemical equation.

$$W + 6H_2O_2 \rightarrow WO_3 + 6H_2O \qquad \text{Eq. 1}$$

Detailed examination of the equation 1 shows that the equation 1 is same as the following chemical equations.

$$6H_2O_2 + 6e^- \rightarrow 6H_2O + 3O^{2-}, H_2O_2: \text{Reduction} \qquad \text{Eq. 2}$$

$$W + 3O^{2-} \rightarrow WO_3 + 6e^-, W^0: \text{Oxidation}$$

Although not shown, a third insulation layer is formed over the second insulation layer 41 that is already patterned and the oxide layers 49 to cover the metal line structures M. The third insulation layer is formed of a HDP layer performing a physical vapor deposition (PVD) process. During performing the PVD process, a power ranging from approximately 2,000 W to approximately 8,000 W is exerted in case of a low frequency, and a power ranging from approximately 500 W to approximately 2,000 W is exerted in case of high frequency. The PVD process uses $SiH_4$, oxygen ($O_2$), helium (He), and hydrogen ($H_2$) gases at a temperature ranging from approximately 300° C. to approximately 600° C. and a pressure ranging form approximately 0.5 mTorr to approximately 2 mTorr.

Figure 4:
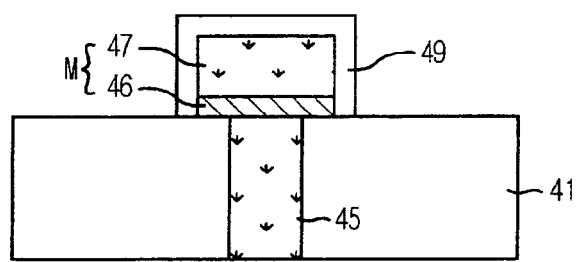
FIG. 4 is a cross-sectional view enlarging a portion 'B' shown in FIG. 3B.

FIG. 4 is a cross-sectional view enlarging a portion 'B' shown in FIG. 3B. The semiconductor memory device according to the embodiment of the present invention has the metal line structure M formed in a stack structure. Specifically, the metal line structure M includes the metal line 47 and the patterned diffusion barrier layer 46, which are formed over the second insulation layer 41 where the contact plug 45 is formed therein. The oxide layer 49 is formed over the surface of the metal line 47 including the patterned diffusion barrier layer 46 as a passivation layer.

The semiconductor memory device according to the embodiment of the present invention does not need an etch stop layer which the typical semiconductor memory device needs and thus, an increase in capacitance by the etch stop layer can be reduced. Accordingly, the metal line 47 can operate at high speed. Also, since the patterned diffusion barrier layer 46 is formed only underneath the metal line 47, an increase in surface resistance by the patterned diffusion barrier layer 46 can be prevented.

Figure 5:
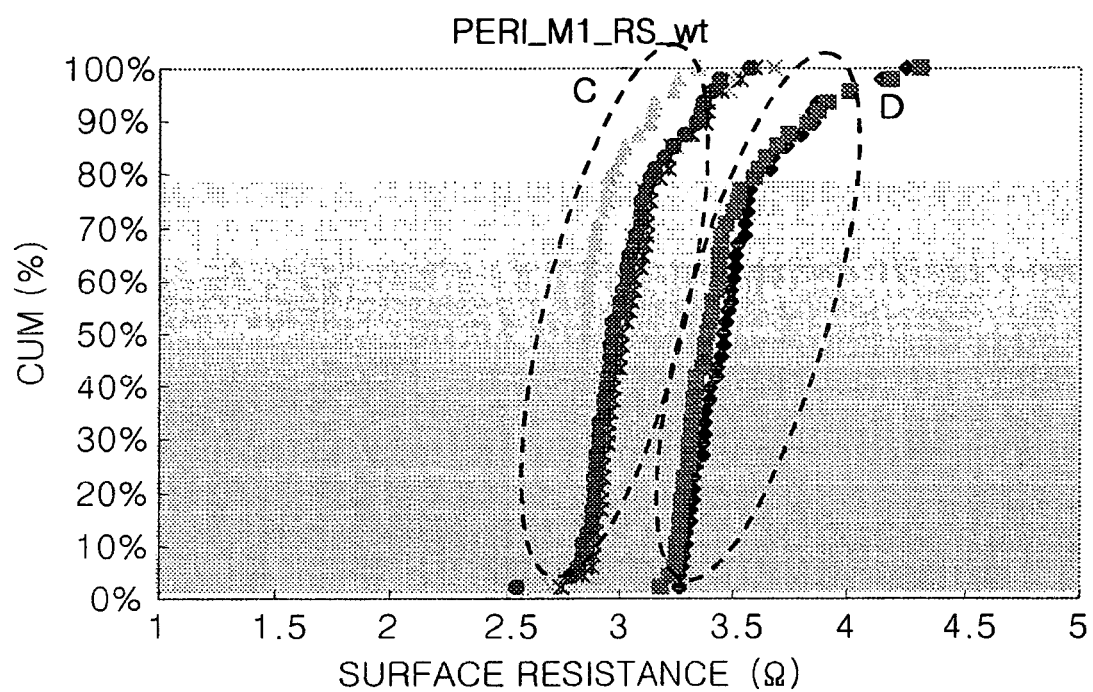
FIG. 5 is a graph showing surface resistance of a metal line fabricated in accordance with an embodiment of the present invention in comparison with that of a typical metal line.

FIG. 5 is a diagram showing a comparison result between surface resistance of a metal line fabricated through a method for fabricating a semiconductor memory device according to an embodiment of the present invention and that of a metal line fabricated through the typical method. A horizontal axis denotes surface resistance measured in ohms, and a vertical axis denotes a distribution of the surface resistance estimated as a cumulative percentage.

A reference letter C shows the distribution of the surface resistance obtained in an improved condition, i.e., through the method according to the embodiment of the present invention. A reference letter D shows the distribution of the surface resistance obtained in a typical condition, i.e., through the typical method. As illustrated, the surface resistance of the metal line fabricated through the method according to the embodiment of the present invention is distributed in a range lower than that of the metal line fabricated through the typical method.

As explained above, the following effects can be obtained according to the embodiment of the present invention. A metal line is formed in a stack structure without performing a dual damascene process. A diffusion barrier layer typically formed along a surface of a T-type metal line is formed only underneath the metal line. As a result, an area of the diffusion barrier layer having high surface resistance can be minimized and thus, a high speed operation which is required for large-scale integration can be obtained.

A surface of the metal line is oxidized to form a metal oxide layer thereon. Accordingly, damage typically generated over the surface of the metal line by a $H_2$ gas or plasma can be reduced during forming an insulation layer after the metal line is formed.

While the present invention has been described with respect to the specific embodiments, it will be apparent to those skilled in the art that various changes and modifications may be made without departing from the spirit and scope of the invention as defined in the following claims. For instance, the fabrication method described in the specific embodiments can be applied for fabrication of various types of semiconductor memory devices including flash memory devices (more particularly, NAND flash memory devices).

What is claimed is:

1. A method for fabricating a semiconductor memory device, comprising:
   forming an insulation layer including a contact hole over a substrate structure;
   forming a plug material to fill the contact hole;
   performing a planarization process onto the plug material to form a contact plug, wherein an upper surface of the contact plug is substantially the same as an upper surface of the insulation layer;
   forming a metal line structure over the insulation layer including the contact plug, the metal line structure including a patterned diffusion barrier layer and a metal line formed over the patterned diffusion barrier layer and contacting the contact plug; and
   oxidizing surfaces of the metal line structure to form a passivation layer over the metal line structure.

2. The method of claim 1, further comprising forming another insulation layer to cover the metal line structure.

3. The method of claim 2, wherein the other insulation layer includes a high density plasma (HDP) layer.

4. The method of claim 1, wherein the oxidizing the surfaces of the metal line structure to form the passivation layer includes using an oxidation chemical to oxidize the surfaces of the metal line structure.

5. The method of claim 4, wherein the oxidation chemical is obtained by mixing $H_2SO_4$, $H_2O_2$, deionized water, and HF.

6. The method of claim 5, wherein a mixing ratio of $H_2SO_4$: $H_2O_2$: deionized water is approximately 2:5:33.

7. The method of claim 6, wherein HF having a flow rate ranging from approximately 100 ppm to approximately 300 ppm is added to the mixture solution of $H_2SO_4$, $H_2O_2$, and deionized water.

8. The method of claim 1, wherein the forming of the metal line structure comprises:
   forming a diffusion barrier layer over the insulation layer;
   forming a metal line layer over the diffusion layer; and
   etching the metal line layer and the diffusion layer to form the metal line structure.

9. The method of claim 8, wherein the diffusion barrier layer includes a titanium (Ti)/titanium nitride (TiN) layer.

10. The method of claim 8, wherein the metal line layer includes tungsten.

11. The method of claim 8, wherein the forming of the metal line layer comprises using $SiH_4$, $WF_6$, and Ar gases at a pressure ranging from approximately 30 Torr to approximately 50 Torr, and a temperature ranging from approximately 300° C. to approximately 400° C.

12. The method of claim 8, wherein the etching of the diffusion barrier layer and the metal line layer to form the metal line structure comprises using $SF_6$ and $N_2$ gases, and a power ranging from approximately 300 W to approximately 500 W at a pressure ranging from approximately 5 mTorr to approximately 10 mTorr, and a temperature ranging from approximately 5° C. to approximately 10° C.

* * * * *